Nov. 29, 1960 H. S. NIKIRK ET AL 2,962,587
RESONANT CIRCUIT TUNING APPARATUS
Filed Feb. 4, 1957
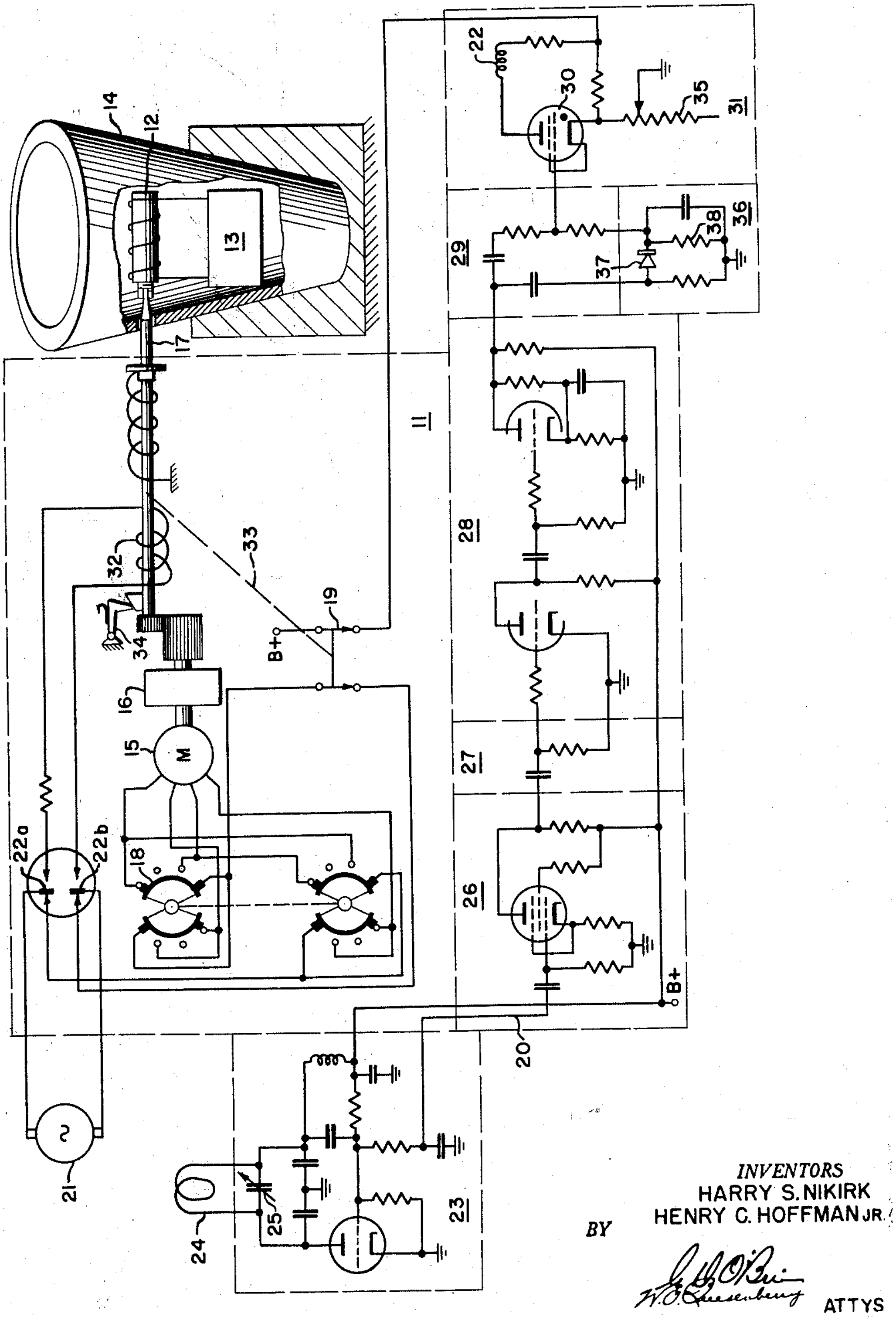
INVENTORS
HARRY S. NIKIRK
HENRY C. HOFFMAN JR.
BY
ATTYS United States Patent Office 2,962,587

Patented Nov. 29, 1960

2,962,587

RESONANT CIRCUIT TUNING APPARATUS

Harry S. Nikirk, Mount Airy, and Henry C. Hoffman, Jr., Catonsville, Md., assignors to the United States of America as represented by the Secretary of the Navy Filed Feb. 4, 1957, Ser. No. 638,183

5 Claims. (Cl. 250—40)

(Granted under Title 35, U.S. Code (1952), sec. 266)

The invention described herein may be manufactured and used by or for the Government of the United States of America for governmental purposes without the payment of any royalties thereon or therefor.

This invention relates generally to the art of adjusting electrical circuits, and, more particularly to a method and apparatus for automatically tuning resonant circuits to a predetermined frequency. While the invention is of general utility in the art hereinabove referred to, it is particularly suitable as an adjunct in tuning, or alignment, operations wherein impediments to the circuit to be adjusted and circuit component, such for example as electron tube, life problems exist.

More specifically, the invention has been found especially suitable for tuning the oscillators of electronic transceivers such for example, as a radiosonde, or the like, in which the tuning element is recessed within a housing.

Heretofore, the stated tuning operation consisted of initially approximately setting the sonde oscillator to the desired frequency with a grid dip meter, energizing the oscillator and more precisely setting the frequency thereof, placing the sonde into a "test can" simulating free space conditions, again applying energizing potentials to the oscillator and measuring the oscillator frequency by means of a frequency meter. This process was repeated several times until the frequency meter indicated the oscillator to be tuned to the prescribed frequency. Such a procedure is obviously inherently laborious and time consuming and requires skilled technical personnel to manipulate and interpret the data obtained. But what is even more important, is that the prolonged energization time of the oscillator circuit materially reduced the life time of the componential electron tubes available for operational requirements.

It is, accordingly, an important object of the present invention to provide a new and improved method of and apparatus for selectively adjusting electrical reactance circuits to a prescribed frequency.

Another object of the present invention is to provide a new and improved method of and apparatus for automatically and accurately tuning an electrical device during a minimum tuning period.

It is a further object of the present invention to provide a new and improved method of and apparatus for setting the operating frequency of an oscillator while in an unenergized condition.

Still another object of the present invention is to provide a new and improved method of and apparatus for automatically tuning an oscillator to a predetermined frequency.

Other objects and many of the attendant advantages of this invention will be readily appreciated as the same becomes better understood by reference to the following detailed description when considered in connection with the accompanying drawing whereon the solitary figure illustrates a detailed schematic diagram of the automatic tuning apparatus constructed in accordance with the principles of the present invention. As shown, the novel electrical apparatus essentially consists of a plurality of successively arranged and cooperating conventional elemental electrical devices and circuits illustrated in the dotted outline blocks, and includes a motor driven tuning assembly, indicated generally by the reference numeral 11, capable of turning the tuning element 12, such for example as a coil slug, in the resonant circuit of oscillator 13 in the radiosonde 14; or other like transceiver device. The tuning device 11 includes an A.C. motor 15, a gear train 16 for stepping down the motor rotational speed, and a spring urged tuning rod, or screwdriver, 17 adaptable to engage the recessed rotatable tuning element 12 of the radiosonde 14. A rotation direction, or reversal, switch 18 and an energizing switch 19 are also included in the tuner assembly 11.

Upon closure of power switch 19, the normally deenergized motor 15 is connected to a suitable energizing potential source 21 through the contacts of switch 18 and relay 22 whereupon the rod 17 rotates the tuning element 12.

A conventional grid-dip oscillator, or meter, 23 is electrically coupled to the oscillator 13 of the sonde 14 by means of antenna 24, which is disposed as to inductively couple the tank circuit of oscillator 13 and which by way of example, is illustrated as a loop of wire. The grid-dip oscillator 23 has been pretuned, by means of variable capacitor 25, to resonate at the prescribed operating frequency desired of the sonde oscillator 13. As the tuning rod 17 continues to rotate the tuning element 12, the resonant frequency of the oscillator 13 tank circuit will approach the resonant frequency to which the grid-dip circuit 23 has been pretuned, and upon reaching this resonant frequency, the tank circuit of oscillator 13 will inductively "load" or detune the grid-dip oscillator circuit. Detuning of the grid-dip circuit 23 causes a voltage variation in the triode grid circuit of meter 23 which voltage variation is transmitted through lead 20 to a conventional amplifier stage 26 wherein the voltage, or signal, variation is amplified. The amplified signal is then fed through a conventional differentiating network 27 to a double triode limiter, or clipper, stage 28 wherein a square wave signal is developed from the differentiated signal applied thereto. The square wave signal is then fed to a second conventional differentiating network 29 and the result differentiated positive impulse signal is applied to the grid of a gas tube 30 in a conventional relay amplifier circuit 31. The positive impulse signal ignites gas tube 30 thereby energizing relay 22, whereupon relay contacts 22*a* and 22*b* are moved from their normal position, as shown, to a moved position. In the moved position, the relay contacts disconnect the motor 15 from the power source 21 and connects the screwdriver solenoid 32 to the power source whereupon the solenoid is energized and the tuning rod 17 is withdrawn from operative engagement with the tuning element 12. Upon withdrawal of tuning rod 17, an arm 33 secured thereto opens switch 19 thereby disconnecting relay amplifier 31 from the operating potential source B+ and deenergizing relay amplifier 31. Opening of switch 19 also effects an interruption of the circuit between the motor 15 and the energy source 21 thereby maintaining the motor deenergized subsequent to the deenergization of relay amplifier 31 and relay 22. A manually operated latch 34, adapted to be tripped upon withdrawal of tuning rod 17, is provided for maintaining the rod in the withdrawn position subsequent to the deenergization of solenoid 32. A variable resistor 35 is included in the cathode circuit of gas tube 30 for establishing the firing impulse signal level therefor.

An obvious advantage of the hereinabove described arrangement for effecting dis-engagement of the tuning rod from the tuning element is the elimination of tuning errors associated with the "backlash" and "overshoot" occurrences which occur in tuning procedures and arrangements wherein engagement is maintained and the driving motor merely braked.

It has been found experimentally that noise generated from any mechanical vibration or slight movement of the radiosonde 14, will result in a slight variation of the coupling between the oscillator 13 and the antenna 24, which may result in the development of a premature firing impulse. This undesirable effect has been found to be more pronounced as the resonant condition is approached. In order to eliminate this noise trouble, a noise suppression circuit 36 is incorporated in the novel circuit, wherein a crystal, or metallic type diode 37 is rendered conductive in response to any noise energy coming through the circuit. Upon being rendered conductive, a negative potential signal is developed across resistor 38 which potential tends to increase the negative bias of the gas tube 30 by an amount equal to the negative peak value of the noise signal. In this manner, the increased negative bias counteracts the increase in signal amplitude arising from noise.

It will be apparent to those skilled in the art that while the automatic tuning method and apparatus of the present invention has been described and illustrated with particularity with reference to the tuning of a radiosonde, it is not necessarily so limited in its application and may be used with equal advantage to adjust any like transceiver or, for that matter, any resonant electrical circuit having adjustable tuning elements.

Obviously many modifications and variations of the present invention are possible in the light of the above teachings. It is therefore to be understood that within the scope of the appended claims the invention may be practiced otherwise than as specifically described.

What is claimed as new and desired to be secured by Letters Patent of the United States is:

1. In a resonant circuit tuning apparatus for automatically tuning an unenergized radiosonde oscillator comprising a tuning rod means including a tuning rod rotatable and slidable about the axis thereof and a solenoid disposed thereon for withdrawing the rod when the solenoid is energized, the said tuning rod being normally connected at one end thereof to the tuning element of a radiosonde oscillator, motor means connected to said tuning rod for causing rotation thereof as the motor operates, grid dip oscillator means inductively coupled to the radiosonde oscillator to be tuned, said grid dip oscillator operating at a fixed frequency for producing a control signal when the radiosonde oscillator has been tuned to a frequency which closely approaches a resonant condition with respect to the grid dip oscillator, amplifier means connected to the said grid dip oscillator for amplifying the said control signal, control means electrically connected to the output of said amplifier, said control means including a relay operable by the amplified control signal said relay being connected to the solenoid and to the motor means in such manner that said motor means is deenergized and the solenoid is energized upon operation of said relay.

2. A circuit tuning apparatus as recited in claim 1 wherein the amplifier means includes a first amplifier stage for amplifying said control signal, a double triode limiter stage connected to the output of the said first amplifier stage and having means therein for developing the amplified control signal into a square wave control signal, a differentiating network connected to the output of said limiter stage, said network having a noise filter means therein, whereby the output control signal of the said differentiating network is a differentiated positive impulse control signal, a thyratron tube having the grid control element thereof connected to the output of said network, and the plate element of the thyratron connected to said relay.

3. In a resonant circuit tuning apparatus for automatically tuning an unenergized radiosonde oscillator and comprising a tuning means normally engaging the tuning element of the radiosonde oscillator for tuning the resonant frequency thereof, grid dip oscillator means for inductively coupling the radiosonde oscillator to be tuned, said grid dip oscillator means operating at a fixed frequency and producing a control signal when the radiosonde oscillator has been tuned to a frequency which closely approaches a resonant condition with respect to the grid dip oscillator means, amplifier means connected to said grid dip oscillator means for amplifying said control signal, said amplifier means including a noise suppression circuit therein, and control means electrically connected to the output of said amplifier means and responsive to said control signal therefrom for disengaging said tuning means from the tuning element.

4. The resonant circuit tuning apparatus of claim 3 in which the tuning means comprises a tuning rod rotatable and slidable about the axis thereof and normally engaging the tuning element of the radiosonde oscillator, motor means connected to said tuning rod for causing rotation thereof as the motor means operates, a source of power, switching means connecting said motor means to said source of power for causing said motor means to rotate in a particular direction; and said control means removing said tuning rod from engagement with the tuning element of the radiosonde oscillator.

5. The resonant circuit tuning apparatus of claim 4 in which said control means comprises a relay responsive to said control signal said relay having said source of power connected thereto and having a first and second set of contacts thereon, said first set of contacts normally connecting said source with said switching means, a solenoid encircling said tuning rod for slidably disengaging said tuning rod from the tuning element when the solenoid is energized said second set of contacts being connected to said solenoid, whereby when said control signal energizes said relay the source of power is disconnected from said first set of contacts and connected to said second set of contacts energizing the solenoid to cause the tuning rod to be slidably disengaged from the tuning element.

References Cited in the file of this patent

UNITED STATES PATENTS

| | | |
|---|---|---|
| 1,579,935 | Heising | Apr. 6, 1926 |
| 2,056,200 | Lowell | Oct. 6, 1936 |
| 2,358,127 | Hermansen | Sept. 12, 1944 |
| 2,382,203 | Chandler | Aug. 14, 1945 |
| 2,468,350 | Sunstein | Apr. 26, 1949 |
| 2,493,741 | Andrews | Jan. 10, 1950 |
| 2,499,858 | Gull | Mar. 7, 1950 |
| 2,584,004 | Enslein | Jan. 29, 1952 |